US011581296B2

(12) United States Patent
Lei et al.

(10) Patent No.: US 11,581,296 B2
(45) Date of Patent: Feb. 14, 2023

(54) LIGHT EMITTING SUBSTRATE, LIGHT EMITTING MOTHERBOARD, METHOD FOR OBTAINING LIGHT EMITTING SUBSTRATE, AND DISPLAYING DEVICE

(71) Applicants: Hefei Xinsheng Optoelectronics Technology Co., Ltd., Anhui (CN); BOE TECHNOLOGY GROUP CO., LTD., Beijing (CN)

(72) Inventors: Jie Lei, Beijing (CN); Zouming Xu, Beijing (CN); Jian Tian, Beijing (CN); Chunjian Liu, Beijing (CN); Xintao Wu, Beijing (CN); Jie Wang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/350,910

(22) Filed: Jun. 17, 2021

(65) Prior Publication Data

US 2022/0271020 A1 Aug. 25, 2022

(30) Foreign Application Priority Data

Oct. 15, 2020 (CN) ......................... 202011105780.8

(51) Int. Cl.

| | |
|---|---|
| ***G09G 3/32*** | (2016.01) |
| ***H01L 25/16*** | (2023.01) |
| ***G09G 3/20*** | (2006.01) |
| ***G09G 3/34*** | (2006.01) |

(Continued)

(52) U.S. Cl.

CPC ......... *H01L 25/167* (2013.01); *G09G 3/2088* (2013.01); *G09G 3/32* (2013.01); *G09G 3/342* (2013.01); *G09G 3/3426* (2013.01); *G09G 3/3666* (2013.01); *H01L 27/3276* (2013.01); *G09G 2300/0408* (2013.01);

(Continued)

(58) Field of Classification Search

CPC ....... G09G 3/2088; G09G 3/32; G09G 3/3426

See application file for complete search history.

(56) References Cited

U.S. PATENT DOCUMENTS

| | | | | |
|---|---|---|---|---|
| 6,961,993 | B2 * | 11/2005 | Oohata | H04N 9/30 438/30 |
| 10,909,911 | B1 * | 2/2021 | Zheng | G09G 5/10 |
| 11,250,771 | B2 * | 2/2022 | Wei | G09G 3/3233 |

(Continued)

*Primary Examiner* — Gene W Lee

(74) *Attorney, Agent, or Firm* — Intellectual Valley Law, P.C.

(57) ABSTRACT

A light emitting substrate, a light emitting motherboard, a method for obtaining a light emitting substrate, and a displaying device. The light emitting substrate comprises a substrate and multiple light emitting units, wherein the substrate is provided with a light emitting region and a bind region located on one side of the light emitting region; each light emitting unit comprises a light zone provided with at least one light emitting diode and a drive circuit provided with multiple pins, and the multiple light emitting units are arranged on the substrate in an array; a direction pointing from the light emitting region to the bind region is a first direction; and in the first direction, the drive circuit of at least one light emitting unit in the last row of the light emitting units is connected to an address line.

13 Claims, 4 Drawing Sheets

100
110
200
210
10
40
20
30
220
First direction
300
410
500
420
120

(51) Int. Cl.
*G09G 3/36* (2006.01)
*H01L 27/32* (2006.01)

(52) U.S. Cl.
CPC ............... *G09G 2310/0202* (2013.01); *G09G 2310/0221* (2013.01); *G09G 2320/0233* (2013.01)

(56) References Cited

U.S. PATENT DOCUMENTS

| | | | | |
|---|---|---|---|---|
| 11,257,421 | B2 * | 2/2022 | Wei | H01L 25/167 |
| 11,289,011 | B2 * | 3/2022 | Wei | H05B 45/28 |
| 11,308,890 | B2 * | 4/2022 | Gray | H04B 3/54 |
| 2018/0218670 | A1 * | 8/2018 | Huska | H01L 25/167 |
| 2021/0343231 | A1 * | 11/2021 | Gray | H04B 3/542 |
| 2021/0408432 | A1 * | 12/2021 | Wei | H01L 51/56 |
| 2022/0036831 | A1 * | 2/2022 | Gray | H04B 3/54 |
| 2022/0139316 | A1 * | 5/2022 | Liu | G09G 3/3233<br>345/214 |

* cited by examiner

LIGHT EMITTING SUBSTRATE, LIGHT EMITTING MOTHERBOARD, METHOD FOR OBTAINING LIGHT EMITTING SUBSTRATE, AND DISPLAYING DEVICE

CROSS REFERENCE TO RELEVANT APPLICATIONS

The application claims priority to Chinese Patent Application No. 202011105780.8, filed on Oct. 15, 2020, the contents of which are incorporated herein by reference in its entirety.

TECHNICAL FIELD

The present disclosure relates to the field of display, in particular to a light emitting substrate, a light emitting motherboard, a method for obtaining a light emitting substrate, and a displaying device.

BACKGROUND

Mini light emitting diodes (Mini-LEDs) and micro light emitting diodes (Micro-LED) are the major updating orientation of liquid crystal display products, and the study on the mini light emitting diodes and the micro light emitting diodes is increasing day-by-day. Compared to organic light emitting diodes (OLED) display products that have been widely used, the mini light emitting diodes and the micro light emitting diodes have a thinner and lighter panel, a higher contrast and a longer service life, thus having the advantage of being good in the uniformity of emitted-light brightness. The study on the mini light emitting diodes and the micro light emitting diodes focuses on cutting large light emitting substrates into small light emitting substrates to obtain light emitting substrates with different sizes to adapt to different application scenarios.

SUMMARY

In one aspect of the present disclosure, a light emitting substrate is provided, comprising:

a substrate provided with a light emitting region and a bind region located on a side of the light emitting region; and multiple light emitting units, a respective one of which comprising a light zone provided with at least one light emitting diode and a drive circuit provided with multiple pins, the multiple light emitting units being arranged on the substrate in an array;

wherein, a direction pointing from the light emitting region to the bind region is a first direction, and in the first direction, the drive circuit of at least one said light emitting unit in a last row of light emitting units is connected to an address line.

Optionally, the drive circuit comprises a first input terminal, a common voltage terminal, a second input terminal and an output terminal;

the output terminal is connected to the light zone, and a light emitting unit connected to the address line without drive circuits of other light emitting units is a first light emitting unit;

the output terminal of a respective light emitting unit is connected to the first input terminal of a next adjacent light emitting unit in a same row, at least two said light emitting units that are located in a same row and are connected constitute a series light emitting unit group, and a last light emitting unit in the series light emitting unit group is farthest from the first light emitting unit.

Optionally, light emitting diodes in the light zone comprise at least one of a mini light emitting diode or a micro light emitting diode.

Optionally, the first light emitting unit is located in a last row in the first direction, and in a direction opposite to the first direction, the output terminal of the last light emitting unit in a previous series light emitting unit group is connected to the first input terminal of an initial light emitting unit in a next series light emitting unit group; and the initial light emitting unit in each said series light emitting unit group is located in a same column as the first light emitting unit.

Optionally, each said series light emitting unit group comprises one said first light emitting unit, and in the first direction, the output terminal of the last light emitting unit in a previous series light emitting unit group is connected to the first input terminal of the first light emitting unit in the next series light emitting unit group; and a switching thin-film transistor is disposed between the address line and the first light emitting unit.

Optionally, the address line is connected to the first input terminal of the first light emitting unit in each said series light emitting unit group, and the last light emitting unit in each said series light emitting unit group is connected to an output line; and last light emitting units respectively in multiple series light emitting unit groups are located in a same column.

Optionally, the light emitting substrate further comprises a power line, the power line is connected to the second input terminal of the drive circuit.

Optionally, the power line comprises a first power line and a second power line, the first power line is connected to second input terminals respectively of the multiple light emitting units located in a same column as the first light emitting unit; and the second power line is connected to second input terminals respectively of last light emitting units respectively in said series light emitting unit group.

Optionally, the light emitting substrate further comprises drive voltage lines, wherein one said light emitting diode in the light zone is connected to one of the drive voltage lines, multiple light emitting diodes in the light zone are connected in series, and tail ends of the multiple light emitting diodes connected in series are connected to output pins of the drive circuit.

In another aspect of the present disclosure, a light emitting motherboard is provided, comprising:

a motherboard substrate provided with at least two substrate regions, wherein at least one said substrate region is provided with the above multiple light emitting units and the above address line.

Optionally, the motherboard substrate comprises a first region and a second region, wherein an area of the first region is greater than that of an area of the second region.

Optionally, the first region is rectangular, a first size of the second region is equal to a first size of the first region, and a second size of the second region is smaller than a second size of the first region, the first size is a size along first sides, the second size is a size along second sides, and the first sides are perpendicular to the second sides.

Optionally, in the second region, the address line is connected to the drive circuit of the at least one said light emitting unit, a first light emitting unit connected to the address line is located on a side, close to an edge of the motherboard substrate extending in a second direction, of the second region, and the second direction is perpendicular to the first direction; and a next series light emitting unit group connected to a series light emitting unit group comprising the first light emitting unit is located on a side away from the edge of the motherboard substrate extending in the second direction.

In another aspect of the present disclosure, a method for obtaining a light emitting substrate is provided, wherein the light emitting substrate is obtained by cutting the above light emitting motherboard.

In another aspect of the present disclosure, a displaying device is provided, comprising a display panel and the above light emitting substrate, and, the display panel is located on a light emitting side of the light emitting substrate.

The above description is only an overview of the technical solution of this disclosure, which can be implemented according to the contents of the specification in order to understand the technical means of this disclosure more clearly, and in order to make the above and other objects, features and advantages of this disclosure more obvious and understandable, the detailed description of this disclosure will be given below.

BRIEF DESCRIPTION OF THE DRAWINGS

In order to explain the technical solution in the embodiments of the disclosure or related arts more clearly, the drawings used in the description of the embodiments or related arts will be briefly introduced below. Obviously, the drawings in the following description are only some embodiments of the disclosure, and for those of ordinary skill in the art, other drawings can be obtained according to these drawings without paying creative labor.

The embodiments of the present disclosure will be described below in conjunction with the accompanying drawings to make the above and/or other aspects and advantages of the present disclosure obvious and be easily understood. Wherein.

DETAILED DESCRIPTION

The embodiments of the present disclosure will be described in detail below, and examples of the embodiments are illustrated by the accompanying drawings, in which identical or similar reference signs represent identical or similar components, or components with identical or similar functions throughout the specification. The embodiments described below with reference to the accompanying drawings are illustrative ones merely for explaining the present disclosure, and should not be construed as limitations of the present disclosure.

The inventor puts forwards the application after discovering the following problems:

According to the backlight design of existing light emitting diodes, two columns of light emitting units are controlled by one address line, which, from a bind region at the tail end of a substrate, is connected to a first input terminal of a drive circuit of a first light emitting unit in the first row and first column at the top end of the substrate, and then an address signal is transmitted between first input terminals and output terminals of drive circuits of two columns of light emitting units and is finally output from an output terminal of a drive circuit of the last light emitting unit in the second column of the last row to be transmitted into the bind region. The inventor finds that the circuit design of the address line of existing large light emitting substrates is not suitable for cutting the large light emitting substrates into small light emitting substrate because the address lines between existing light emitting units are connected in series and only the drive circuits of the first light emitting units in the top row of the substrate are able to directly receive an address signal, so when a large light emitting substrate is cut, only the light emitting units still in series contention with the address lines by means of the first light emitting units in the top row of the substrate are able to be addressed and have a display function, and the other light emitting units that are not kept in series connection with the address lines by means of the first light emitting units in the top row of the substrate will not be addressed and do not have a display function.

The application aims to solve, to some extent, one of the technical problems in the related art.

Figure 1:
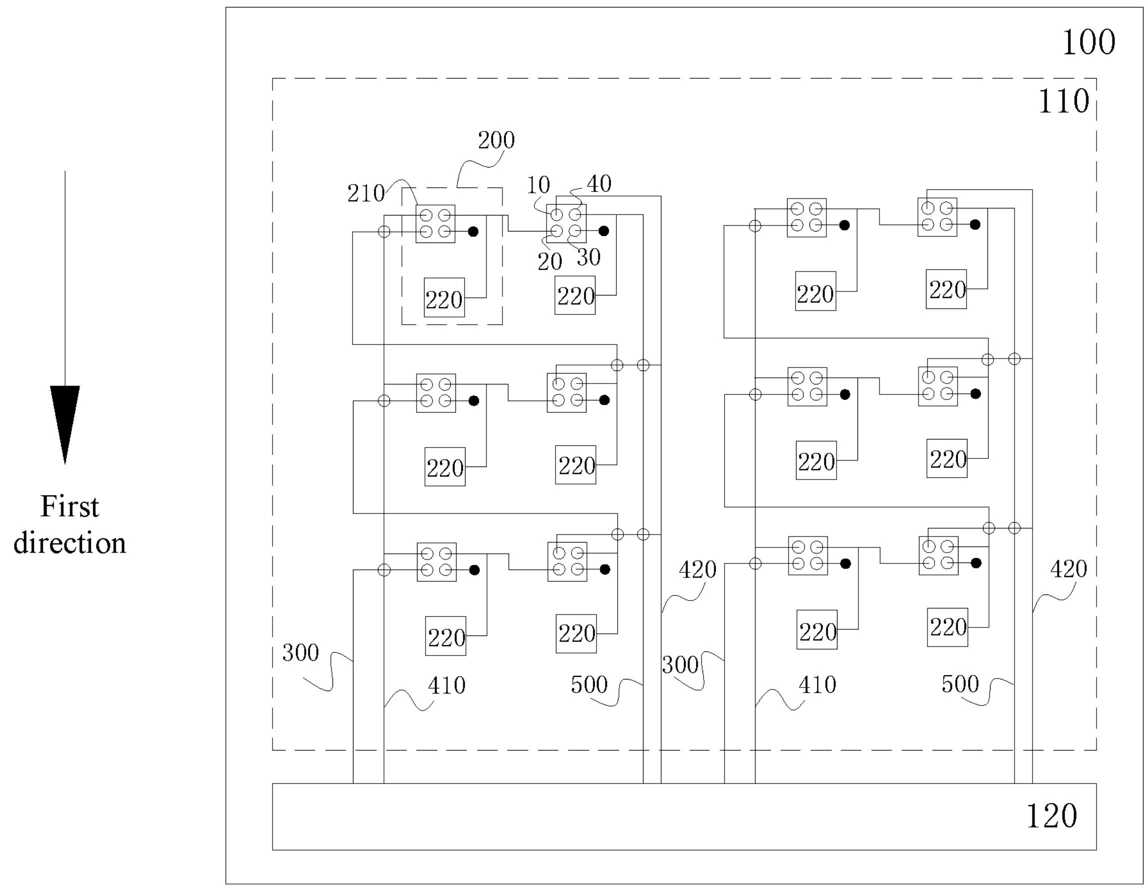
FIG. 1 illustrates a structural diagram of a light emitting substrate according to one embodiment of the present disclosure.

In one aspect of the application, the present disclosure provides a light emitting substrate which, as shown in FIG. 1, comprises: a substrate 100 and multiple light emitting units 200, wherein the substrate 100 is provided with a light emitting region 110 and a bind region 120 located on one side of the light emitting region 110; each light emitting unit 200 comprises a light zone 220 provided with at least one light emitting diode and a drive circuit 210 provided with multiple pins; the multiple light emitting units 200 are arranged on the substrate 100 in an array; a direction pointing from the light emitting region 110 to the bind region 120 is a first direction; and in the first direction, the drive circuit 210 of at least one light emitting unit 200 in the last row of light emitting units 200 is connected to an address line 300, that is to say, at least one light emitting unit 200 is directly connected to the address line 300 without other light emitting units 200. In this way, light emitting substrates of different sizes may be obtained, signals may be transmitted between the light emitting units by means of the address line, and the uniformity of the emitted-light brightness of the light emitting substrate is improved.

According to some embodiments of the present disclosure, the type of the light emitting diodes in the light zones is not particularly limited. For example, the light emitting diodes in the light zones may be one or more of mini light emitting diodes and micro light emitting diodes.

It should be particularly noted here that the black hollow circle in the drawings indicates that two lines involved are not crossed, that is to say, the black hollow circle represents that the orthographic projections of the two lines on the substrate are crossed, but the two lines are not connected.

Figure 6:
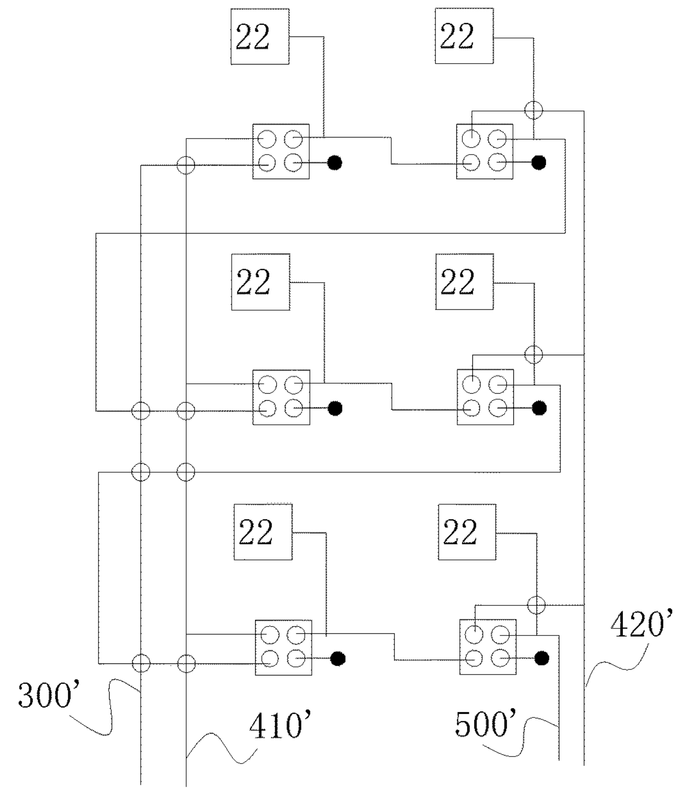
FIG. 6 illustrates a structural diagram of a light emitting substrate in the related art.

For the sake of a good understanding, the principle of the light emitting substrate capable of fulfilling the above beneficial effects will be briefly explained below with reference to FIG. 1 and FIG. 6.

In the related art, one light emitting unit comprises a light zone 22 provided with four LED lights, one LED light in the light zone 22 obtains a voltage and a current from a drive voltage line, and then the voltage and current flow to an output terminal of a drive circuit from a cathode of the fourth LED light; power is supplied to the drive circuit by a first power line 410' and a second power line 420'. An address line 300' of the light emitting unit is connected from a bind region to a first input terminal of a drive circuit of the first column of light emitting unit in a row farthest from the bind region, is then led out from an output terminal of the drive circuit of this light emitting unit to be connected to a first input terminal of a drive circuit of the adjacent light emitting unit in the same row, is then led out and led in sequentially, and is finally led out of an output terminal of a drive circuit of the last light emitting unit in the same row to be connected to a first input terminal of a drive circuit of the light emitting unit on the side close to the bind region. In this way, an address signal is transmitted between the light emitting units and is eventually output by an output line 500'. However, such a circuit design cannot meet the requirement for cutting a large light emitting substrate to obtain a small light emitting substrate due to the fact that only the row of light emitting units farthest from the bind region can obtain the address signal after the large light emitting substrate is cut and other light emitting units cannot perform addressing, that is, the display function is disabled.

In the present disclosure, an address line signal from the bind region is accessed to a first input terminal of the drive circuit of the light emitting unit closest to the bind region, then an output terminal of the drive circuit of this light emitting unit is connected to a first input terminal of the drive circuit of the adjacent light emitting unit in the same row, the connection is performed by analogy until an output terminal of the drive circuit of the last light emitting unit in the same row is connected to a first input terminal of the drive circuit of the adjacent light emitting unit on the side away from the bind region, and in this way, the signal is transmitted between the light emitting units. By adoption of such a design, the address signal is input to the light emitting unit on the side close to the bind region, so that when a small light emitting substrate is needed, the light emitting substrate meeting size requirements may be prepared from the light emitting units on the side close to the bind region. Besides, in the present disclosure, the address line is connected to the first input terminal of the drive circuit of the first light emitting unit in each row and is then led out from the output terminal of the drive circuit of the first light emitting unit in each row to be connected to the first input terminal of the adjacent light emitting unit in the same row to provide an independent address signal for each row of light emitting units, so that a small light emitting substrate may be obtained by independently providing an address signal for each light emitting unit. On this basis, when a small light emitting substrate is prepared on a light emitting motherboard, a large light emitting substrate is prepared at first according to a common circuit design, and then the large light emitting substrate is cut; because the address line is connected to the first input terminal of the drive circuit of each light emitting unit, the light emitting units in each row are still connected to the address line after cutting, and the display function is normal.

Figure 2:
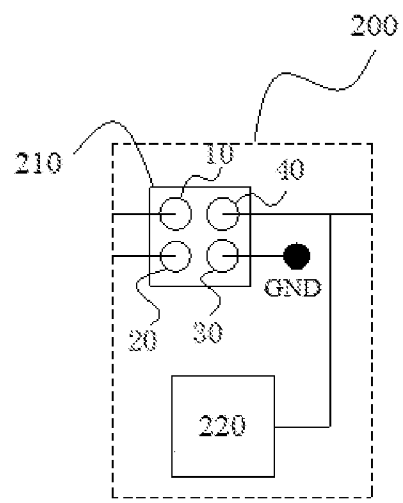
FIG. 2 illustrates a partial structural diagram of the light emitting substrate according to the embodiment of the present disclosure.

According to some embodiments of the present disclosure, terminals of the drive circuit 210 are not particularly limited, for example, the drive circuit may comprise a first input terminal 20, a common voltage terminal 30, a second input terminal 10 and an output terminal 40, as shown in FIG. 2. Specifically, the common voltage terminal may be grounded, which is illustrated by GND in FIG. 2. According to some embodiments of the present disclosure, the output terminal 40 is electrically connected to the light zone 220, so whether the light zone emits light and the emitted-light brightness of the light zone may be controlled according to an address signal input by the address line. According to some embodiments of the present disclosure, the multiple light emitting units may be synchronously controlled by means of a series connection of the address line to improve the light emitting uniformity of different light emitting units. The series connection manner of the address line is not particularly limited. For example, the light emitting unit that is connected to the address line without the drive circuits of other light emitting units and is located in the last row in the first direction is defined as a first light emitting unit, that is, the first light emitting unit is connected to the bind region without the drive circuits of other light emitting units. The output terminal of each light emitting unit is connected to the first input terminal in the next adjacent light emitting unit in the same row, at least two light emitting units that are located in the same row and connected to each other constitute a series light emitting unit group, and the last light emitting unit in the series light emitting unit group in this row is farthest from the first light emitting unit.

According to some embodiments of the present disclosure, the connection between the address line and the drive circuits of the light emitting units is not particularly limited. For example, the first light emitting unit in the last row in the first direction is connected to the address line, and the first light emitting unit is located in the last row in the first direction; in a direction opposite to the first direction, the output terminal in the last light emitting unit in the previous series light emitting unit group is connected to the first input terminal of the initial light emitting unit in the next series light emitting unit group; and the initial light emitting unit in each series light emitting unit group is located in the same column as the first light emitting unit. In this way, multiple light emitting units are connected in series to obtain the series light emitting unit group. When the address line is connected to the light emitting units in such as manner, a large light emitting substrate may be cut to obtain a small light emitting substrate. Because the first light emitting unit is connected to the address line, the other light emitting units connected in series to the first light emitting unit are also able to obtain an address signal input by the address line, so the small light emitting substrate obtained by cutting the large light emitting substrate has a display function as long as the small light emitting substrate comprises the row including the first light emitting unit, and the display effect of the small light emitting substrate is the same as that of the large light emitting substrate.

Figure 3:
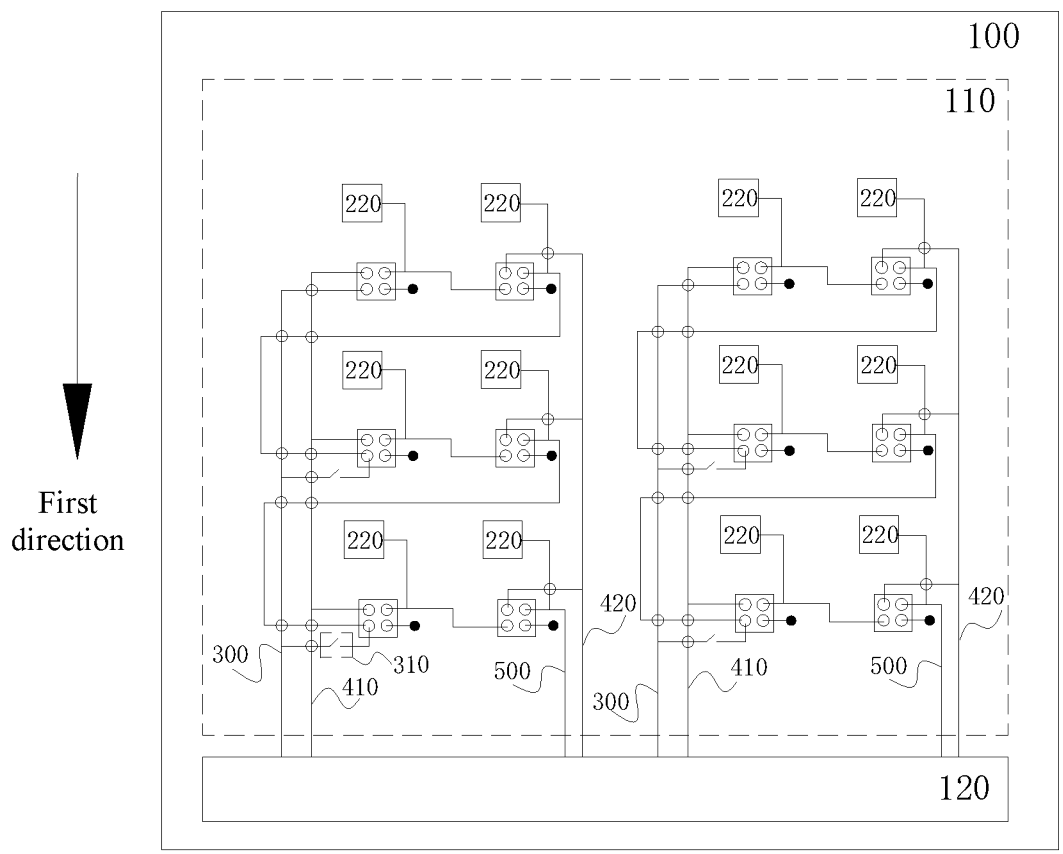
FIG. 3 illustrates a structural diagram of a light emitting substrate according to another embodiment of the present disclosure.
Figure 4:
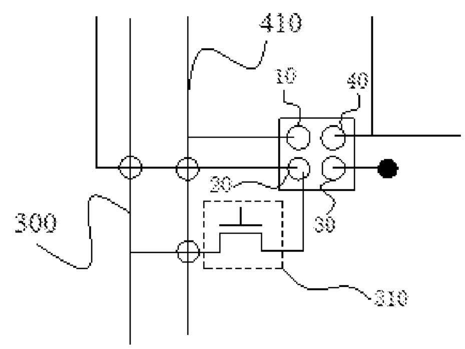
FIG. 4 illustrates a partial structural diagram of the light emitting substrate according to the embodiment of the present disclosure.

According to some embodiments of the present disclosure, referring to FIG. 3 and FIG. 4, the connection between the address line and the drive circuits of the light emitting units is not particularly limited. For example, the first light emitting unit in the last row in the first direction is connected to the address line, and each series light emitting unit group comprises one first light emitting unit; in the first direction, the output terminal in the last light emitting unit in the previous series light emitting unit group is connected to the first input terminal in the first light emitting unit in the next series light emitting unit group; and a switching thin-film transistor is disposed between the address line and the first light emitting unit. That is, multiple light emitting unit groups are cascaded. When the address line is connected to the light emitting units in such a manner, after a small light emitting substrate is obtained by cutting a large light emitting unit, the switching thin-film transistors corresponding to the light emitting unit groups in different rows have different cut-in voltages, so the switching thin-film transistor of the light emitting unit group in the row closest to the cut edge may be turned on by setting the cut-in voltage to allow an address signal input by the address line to be transmitted only to the first input terminal of the drive circuit of the light emitting unit at one end of the row, closest to the cut edge, of the small light emitting substrate, then the address signal is transmitted from the output terminal of this light emitting unit to the first input terminal of the drive circuit of the adjacent light emitting unit in the same row through a connecting line, and the address signal is transmitted in and out in sequence; and when the light emitting units in the same row are connected in series, the address signal is transmitted from the output terminal of the drive circuit of the last light emitting unit in the same row to the first input terminal of the drive circuit of the light emitting unit at one end of the adjacent row away from the cut edge, and the address signal is transmitted in and out in sequence, and finally, the output terminal the drive circuit at the tail end of the series light emitting unit group in the row farthest from the cut edge, namely the last row in the first direction, of the small light emitting substrate is connected to an output line to form a conducting circuit.

Figure 5:
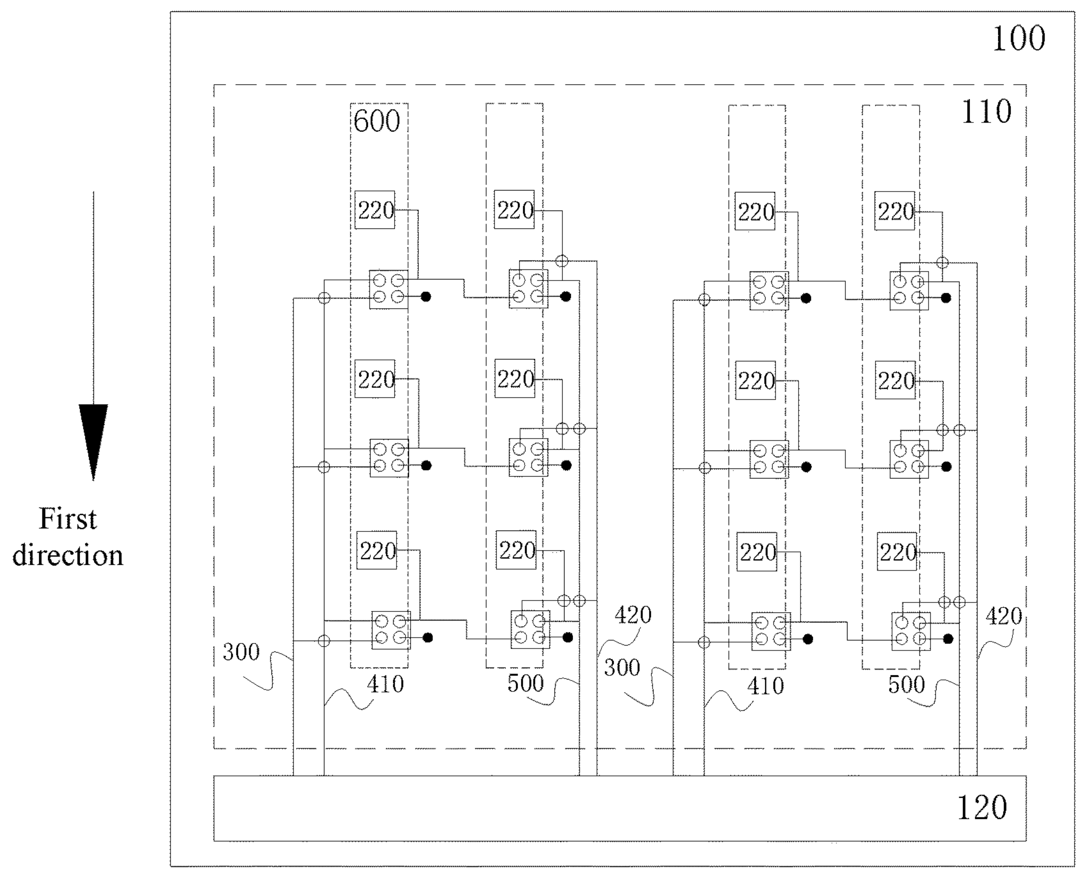
FIG. 5 illustrates a structural diagram of a light emitting substrate according to another embodiment of the present disclosure.

According to some embodiments of the present disclosure, referring to FIG. 5, the connection between the address line 300 and the drive circuits of the light emitting units is not particularly limited. For example, the address line 300 is connected to the first input terminal of the first light emitting unit in each series light emitting unit group, the output terminal of the last light emitting unit in each series light emitting unit group is connected to an output line, and the last light emitting units in the multiple series light emitting unit groups are located in the same column. The output terminal of the last light emitting unit in each light emitting unit group is not only connected to the light zone, but also is connected to the output line to form a conducting circuit and facilitate the location of the light emitting units. Because the waveforms received by the series light emitting unit groups in different rows are different, the series light emitting unit groups may be numbered according to the waveforms received by the series light emitting unit groups, and then, the positions of the series light emitting unit groups are determined according to different waveform signals collected. When a light emitting substrate is manufactured based on such as circuit design, a signal input by the address line may still be transmitted to the light emitting units in each row after a small light emitting substrate is obtained by cutting a large light emitting substrate, and the small light emitting substrate has the same display effect as the large light emitting substrate. For example, the small light emitting substrate obtained by cutting the large light emitting substrate still has a complete circuit structure, so the address signal can still be input from the bind region to the drive circuit of the first light emitting unit of the light emitting unit group in each row, is then transmitted in and out between the light emitting units connected in series in the light emitting unit group in each row, and is finally output to the output line from the output terminal of the last light emitting unit in the light emitting unit group to form a conducting circuit. In this way, a smaller light emitting substrate may be obtained by cutting a large substrate from the middle.

According to some embodiments of the present disclosure, the light emitting substrate may further comprise a power line, and the power line may be connected to the second input terminals of the drive circuits. Furthermore, the light emitting substrate may comprise a first power line 410 and a second power line 420, wherein the first power line is connected to the second input terminals of the multiple light emitting units located in the same column as the first light emitting unit, and the second power line is connected to the second input terminal of the last light emitting unit in each series light emitting unit group. In this way, power is supplied to the drive circuits of the light emitting units by the first power line and the second power line. According to some embodiments of the present disclosure, referring to FIG. 5, the light emitting substrate may further comprise drive voltage lines 600, wherein one light emitting diode in each light zone is connected to one drive voltage line, the multiple light emitting diodes in each light zone are connected in series, and the tail ends of the multiple light emitting diodes connected in series are connected to the output terminal of the drive circuit. Specifically, the multiple drive voltage lines may be connected to the same voltage terminal to realize unified control over multiple columns of light zones. In this way, the drive voltage lines are used to supply power to the light zones of the light emitting units.

Figure 7:
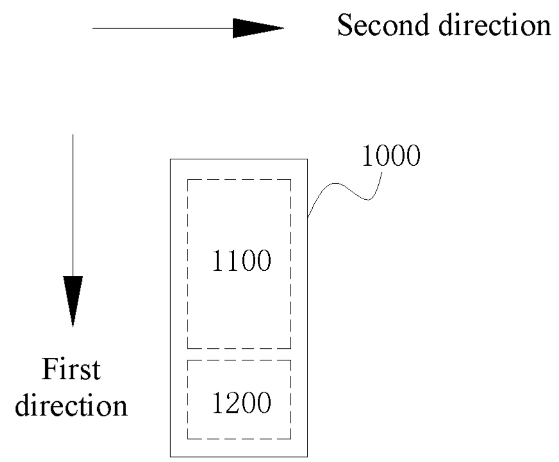
FIG. 7 illustrates a structural diagram of a light emitting motherboard according to one embodiment of the present disclosure.
Figure 8:
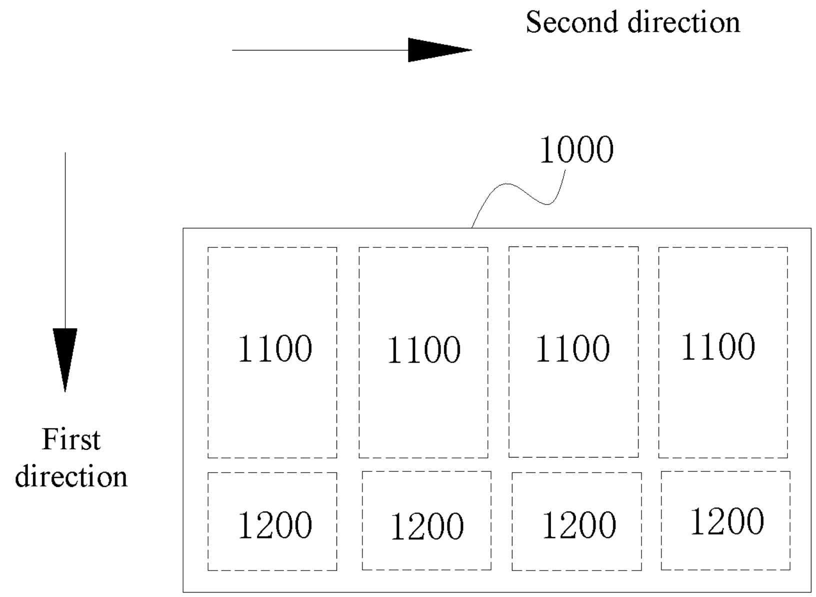
FIG. 8 illustrates a structural diagram of a light emitting motherboard according to another embodiment of the present disclosure.

In another aspect, referring to FIG. 7 and FIG. 8, the present disclosure provides a light emitting motherboard comprising: a motherboard substrate 1000, wherein the motherboard substrate 1000 is provided with at least two substrate regions, and at least one substrate region is provided with the multiple light emitting units arranged in the above-mentioned manner and the address line. By arranging the light emitting units on the motherboard in the above-mentioned manner, the utilization ratio of the motherboard is increased.

According to some embodiments of the present disclosure, referring to FIG. 7, the motherboard substrate 1000 may comprise a first region 1100 and a second region 1200, wherein the area of the first region 1100 is greater than that of the second region 1200, the first region 1100 is rectangular, a first size of the rectangular first region 1100 is the size along first sides, a second size of the rectangular first region 1100 is the size along second sides, and the first sides are perpendicular to the second sides. A first size of the second region 1200 is equal to the first size of the first region 1100, and a second size of the second region 1200 is smaller than the second size of the first region. Wherein, in the second region, an address line is connected to the drive circuit of one light emitting unit, the first light emitting unit connected to the address line is located on a side, close to the edge of the motherboard substrate extending in a second direction, of the second region, the second direction is perpendicular to the first direction, and the next series light emitting unit group connected to the series light emitting unit group comprising the first light emitting unit is located on a side, away from the edge of the motherboard substrate extending in the second direction, of the second region. In the application, the light emitting units may be configured in the second region in the manner provided by the application to enable the whole surface of the light emitting motherboard to emit light normally, that is, a light emitting substrate capable of emitting light normally is formed in the first region 1100, and a light emitting substrate capable of emitting light normally is also formed in the second region 1200, so that the utilization ratio of the motherboard substrate is increased. In addition, light emitting substrates of different sizes may be obtained by cutting the light emitting motherboard. Those skilled in the art would appreciate that only the light emitting units in the second region should be configured in the manner provided by the application, and the configuration of the light emitting units in the first region is not particularly limited. For example, the light emitting units in the first region may be configured in the manner provided by the application or be configured in a manner in the related art. Those skilled in the art may select a specific configuration manner as the case may be.

For the sake of a good understanding, the principle for fulfilling the above beneficial effects of the light emitting motherboard will be briefly explained below with reference to FIG. 7 and FIG. 8:

The utilization ratio of an existing large motherboard substrate 1000 is low. Specifically, when the area of the motherboard substrate 1000 is greater than that of a light emitting substrate product, for example, the size of the light emitting substrate product is close to the size of the first region 1100, as shown in FIG. 7; in this case, considering the second region 1200, the area of which is smaller than that of the first region 1100, on the light emitting motherboard, a complete light emitting substrate shown in FIG. 1 will be formed in the first region 1100 in the related art, and in the preparation process, the copper content of the surface of the motherboard substrate 1000 should be less than 50% as required by the process; because film patterns in the first region 1100 are formed by forming a target material layer on the surface of the whole motherboard substrate and then patterning the target material layer in the first region 1100, in order to ensure that the copper content of the surface of the motherboard substrate 1000 is less than 50%, a mask for patterning the first region 1100 is used to pattern the same film layer in the second region 1200 when the film patterns in the first region 1100 are prepared, that is, light emitting units are prepared in the second region 1200 at the same time to decrease the copper content of the surface of the motherboard substrate; however, when the same mask is used to prepare the same film layer in the first region 1100 and the second region 1200, because the size of the second region 1200 is smaller, the part, overlapping with the first region 1100, of the mask has to be shielded to protect patterns formed in the first region 1100 against damage when the light emitting units in the second region 1200 are prepared by means of the mask, in the related art, and consequentially, only part of a complete light emitting substrate is formed in the second region 1200 finally; in this case, if the light emitting substrate formed by the mask adopts the configuration shown in FIG. 6, that is, the address line is connected to the light emitting units in the initial row in the first direction, part of the area, including the initial row of light emitting units, of the mask is shielded due to the size limitation of the second region 1200, which makes it impossible to form a complete light emitting structure in the second region 1200, so the substrate, corresponding to the second region, obtained by cutting the motherboard substrate 1000 will not be able to emit light normally, which results in a low utilization ratio of the motherboard substrate 1000. In this application, the side, connected to the drive circuit, of the address line 300 shown in FIG. 1 is formed on a short edge, away from the first region 1100, of the second region 1200, that is, only the light emitting unit structure on the lower half of the light emitting substrate shown in FIG. 1 (namely the part provided with the first light emitting units) is formed in the second region 1200. In this case, the address line 300 is connected to the last light emitting unit in the first direction, so all the light emitting units formed in the second region 1200 are able to emit light normally. For example, as shown in FIG. 8, when only four complete light emitting units equivalent in size to the first regions can be disposed on a large motherboard substrate, the four corresponding second regions are also exposed by means of a mask for forming the first regions to ensure that the ratio of copper elements on the motherboard substrate is less than 50%, so as to pattern redundant copper on the motherboard substrate, thus decreasing the copper content of the motherboard substrate. If light emitting units, shown in FIG. 6, in the related art are configured in the second region, only part of the light emitting units required by the light emitting substrate are formed in the second region, are not connected to the address line, and thus cannot obtain an address signal from the bind region and cannot emit light. When light emitting units are configured in the second region in the manner shown in FIG. 1, the first light emitting unit in the light emitting unit group in the last row in the first direction is still connected to the address line, and the output terminal of the last light emitting unit in the initial light emitting unit group in the first direction is connected to the output line to form a conducting circuit, so the light emitting units of this light emitting substrate are able to emit light normally. In this way, the second region 1200 of the light emitting motherboard is also used.

According to some other embodiments of the present disclosure, when the light emitting units of the light emitting substrate shown in FIG. 3 and FIG. 5 are configured in the regions of the light emitting motherboard, the light emitting units required by a complete light emitting substrate shown in FIG. 1 are formed in the first region 1100. Because the second size of the second region 1200 is too small to form a complete light emitting structure, the second region will be unable to emit light if the light emitting units are configured in the second region in the manner shown in FIG. 6. If the light emitting units are configured in the second region in the manner shown in FIG. 3 or FIG. 5, part of series light emitting unit groups are formed in the second region, and the first light emitting unit of the light emitting unit group in the last row in the first direction is still connected to the address line 300, so the light emitting units formed in the second region 1200 are able to emit light normally. In this way, the second region 1200 of the light emitting motherboard is also used.

In another aspect, the present disclosure provides a method for obtaining a light emitting substrate, wherein the light emitting substrate is obtained by cutting the light emitting motherboard mentioned above. Thus, the method has all features and advantages of the light emitting substrate and light emitting motherboard mentioned above, and will no longer be detailed here.

In another aspect, the present disclosure provides a displaying device comprising the light emitting substrate mentioned above and a display panel located on a light emitting side of the light emitting substrate. So, the displaying device has all features and advantages of the light emitting substrate mentioned above, and will no longer be detailed here.

In the description of the present disclosure, terms such as "upper" and "lower" are used to indicate directional or positional relations based on the accompanying drawings merely for the purpose of facilitating the description of the present disclosure, do not indicate that the present disclosure must be configured and operated in a specific direction, and thus should not be construed as limitations of the present disclosure.

In the description of the present disclosure, reference terms such as “one embodiment” and “another embodiment” are intended to indicate that specific features, structures, materials or characteristics described in conjunction with said embodiment are included in at least one embodiment of the present disclosure. In this specification, illustrative descriptions of these terms do not definitely direct at the same embodiment or example. In addition, the specific features, structures, materials or characteristics may be combined in any one or more embodiments or examples in any appropriate manners. Besides, those skilled in the art may combine and integrate different embodiments or examples described in this specification, or the features of different embodiments of examples without any contradictions. Moreover, it should be noted that terms “first” and “second” in this specification are merely for the purpose of description, and should not be construed as indicating or implying relative importance or implicitly indicating the number of technical features referred to.

Although the embodiments of the present disclosure have been illustrated and described above, it should be understood that the above embodiments are merely illustrative ones, and should not be construed as limitations of the present disclosure. Those ordinarily skilled in the art can make variations, modification, substations and transformations to the above embodiments within the scope of the present disclosure.

The invention claimed is:

1. A light emitting substrate, comprising:

a substrate provided with a light emitting region and a bind region located on a side of the light emitting region; and multiple light emitting units, a respective one of which comprising a light zone provided with at least one light emitting diode and a drive circuit provided with multiple pins, the multiple light emitting units being arranged on the substrate in an array;

wherein, a direction pointing from the light emitting region to the bind region is a first direction, and in the first direction, the drive circuit of at least one said light emitting unit in a last row of light emitting units is connected to an address line;

the drive circuit comprises a first input terminal, a common voltage terminal, a second input terminal and an output terminal;

the output terminal is connected to the light zone, and a light emitting unit connected to the address line without drive circuits of other light emitting units is a first light emitting unit; and the output terminal of a respective light emitting unit is connected to the first input terminal of a next adjacent light emitting unit in a same row, at least two said light emitting units that are located in a same row and are connected constitute a series light emitting unit group, and a last light emitting unit in the series light emitting unit group is farthest from the first light emitting unit;

wherein the first light emitting unit is located in a last row in the first direction, and in a direction opposite to the first direction, the output terminal of the last light emitting unit in a previous series light emitting unit group is connected to the first input terminal of an initial light emitting unit in a next series light emitting unit group; and the initial light emitting unit in each said series light emitting unit group is located in a same column as the first light emitting unit.

2. The light emitting substrate according to claim 1, wherein light emitting diodes in the light zone comprise at least one of a mini light emitting diode or a micro light emitting diode.

3. The light emitting substrate according to claim 1, wherein each said series light emitting unit group comprises one said first light emitting unit, and in the first direction, the output terminal of the last light emitting unit in a previous series light emitting unit group is connected to the first input terminal of the first light emitting unit in the next series light emitting unit group; and a switching thin-film transistor is disposed between the address line and the first light emitting unit.

4. The light emitting substrate according to claim 1, wherein the address line is connected to the first input terminal of the first light emitting unit in each said series light emitting unit group, and the last light emitting unit in each said series light emitting unit group is connected to an output line; and last light emitting units respectively in multiple series light emitting unit groups are located in a same column.

5. The light emitting substrate according to claim 1, wherein the light emitting substrate further comprises a power line, and the power line is connected to the second input terminal of the drive circuit.

6. The light emitting substrate according to claim 5, wherein the power line comprises a first power line and a second power line, the first power line is connected to second input terminals respectively of the multiple light emitting units located in a same column as the first light emitting unit; and the second power line is connected to second input terminals respectively of last light emitting units respectively in said series light emitting unit group.

7. The light emitting substrate according to claim 1, further comprising drive voltage lines, wherein one said light emitting diode in the light zone is connected to one of the drive voltage lines, multiple light emitting diodes in the light zone are connected in series, and tail ends of the multiple light emitting diodes connected in series are connected to output pins of the drive circuit.

8. A light emitting motherboard, comprising:

a motherboard substrate provided with at least two substrate regions, wherein at least one said substrate region is provided with the multiple light emitting units and the address line according to claim 1.

9. The light emitting motherboard according to claim 8, wherein the motherboard substrate comprises a first region and a second region, wherein an area of the first region is greater than that of an area of the second region.

10. The light emitting motherboard according to claim 9, wherein the first region is rectangular, a first size of the second region is equal to a first size of the first region, and a second size of the second region is smaller than a second size of the first region, the first size is a size along first sides, the second size is a size along second sides, and the first sides are perpendicular to the second sides.

11. The light emitting motherboard according to claim 10, wherein, in the second region, the address line is connected to the drive circuit of the at least one said light emitting unit, a first light emitting unit connected to the address line is located on a side, close to an edge of the motherboard substrate extending in a second direction, of the second region, and the second direction is perpendicular to the first direction; and a next series light emitting unit group connected to a series light emitting unit group comprising the first light emitting unit is located on a side away from the edge of the motherboard substrate extending in the second direction.

12. A method for obtaining a light emitting substrate, wherein the light emitting substrate is obtained by cutting the light emitting motherboard according to claim 8.

13. A displaying device, comprising a display panel and the light emitting substrate according to claim 1, and, wherein the display panel is located on a light emitting side of the light emitting substrate.

* * * * *